US005258728A

United States Patent [19]

Taniyoshi et al.

[11] Patent Number: 5,258,728

[45] Date of Patent: Nov. 2, 1993

[54] ANTENNA CIRCUIT FOR A MULTI-BAND ANTENNA

[75] Inventors: Kiyoshi Taniyoshi; Toshihiko Kondo; Kazuo Takayama, all of Kobe, Japan

[73] Assignee: Fujitsu Ten Limited, Hyogo, Japan

[21] Appl. No.: 697,624

[22] Filed: May 9, 1991

Related U.S. Application Data

[62] Division of Ser. No. 249,556, Sep. 26, 1988, Pat. No. 5,072,230.

[30] Foreign Application Priority Data

| | | | |
|---|---|---|---|
| Sep. 30, 1987 | [JP] | Japan | 62-149952[U] |
| Sep. 30, 1987 | [JP] | Japan | 62-149953[U] |
| Dec. 8, 1987 | [JP] | Japan | 62-186605[U] |
| Jun. 2, 1988 | [JP] | Japan | 63-74175[U] |

[51] Int. Cl.[5] .................... H03H 7/446; H03H 7/38

[52] U.S. Cl. .................... 333/132; 333/32; 343/860; 370/38

[58] Field of Search .................... 333/126, 129, 132, 32; 343/715, 858, 860, 862; 455/78, 82, 83; 370/36-38

[56] References Cited

U.S. PATENT DOCUMENTS

| | | | |
|---|---|---|---|
| 1,688,036 | 10/1928 | Clement | 343/858 X |
| 2,021,734 | 11/1935 | Macalpine | 343/860 |
| 2,096,782 | 10/1937 | Brown | 333/132 X |
| 3,725,942 | 4/1973 | Ukmar | 455/82 X |
| 3,925,729 | 12/1975 | Amoroso . | |
| 4,085,405 | 4/1978 | Barlow | 333/129 X |
| 4,095,229 | 6/1978 | Elliot | 455/82 X |
| 4,141,016 | 2/1979 | Nelson | 455/83 X |
| 4,268,805 | 5/1981 | Tanner et al. | 333/129 |
| 4,527,168 | 7/1985 | Edwards | 343/901 |
| 4,567,487 | 1/1986 | Creaser, Jr. | 343/900 |
| 4,584,587 | 4/1986 | Ireland | 343/745 |
| 4,658,260 | 4/1987 | Myer | 343/792 |
| 4,660,049 | 4/1987 | Shinkawa | 343/715 |
| 4,675,687 | 6/1987 | Elliott | 343/715 |
| 4,721,965 | 1/1988 | Elliott | 343/715 |
| 4,734,703 | 3/1988 | Nakase et al. | 343/790 |
| 4,748,450 | 5/1988 | Hines et al. | 343/820 |
| 4,829,317 | 5/1989 | Shinkawa | 343/903 |
| 4,839,660 | 6/1989 | Hadzoglou | 343/715 |
| 4,850,034 | 7/1989 | Campbell | 343/715 X |

FOREIGN PATENT DOCUMENTS

| | | | |
|---|---|---|---|
| 1075780 | 4/1980 | Canada | 333/132 |
| 2362889A1 | 12/1973 | Fed. Rep. of Germany . | |
| 2538348A1 | 8/1975 | Fed. Rep. of Germany . | |
| 2538348 | 3/1976 | Fed. Rep. of Germany . | |
| 2755867C2 | 12/1977 | Fed. Rep. of Germany . | |
| 24026 | 2/1977 | Japan | 333/132 |
| 54-58306 | 5/1979 | Japan . | |
| 149518 | 11/1980 | Japan | 333/132 |
| 61-227405 | 10/1986 | Japan . | |
| 62-173801 | 7/1987 | Japan . | |
| 62-179202 | 8/1987 | Japan . | |
| 1401524 | 6/1988 | U.S.S.R. | 333/132 |

OTHER PUBLICATIONS

"Cellular Technology Promises More Channels", Danny Goodman, Technology Today Feb. 1982, pp. 41-49.

*Primary Examiner*—Benny Lee

*Attorney, Agent, or Firm*—Wenderoth, Lind & Ponack

[57] ABSTRACT

A branching filter, which is operatively connected between an antenna and a communication device which utilizes different frequency bands, suppresses a mutual interference between signals transmitted to and from the communication device. An antenna circuit, which is operatively connected between the antenna, or a branching filter, and the communication device, converts an impedance with respect to a signal in a frequency band having a lower frequency, and reduces loss resulting from a capacitive antenna impedance.

4 Claims, 7 Drawing Sheets

ANTENNA CIRCUIT FOR A MULTI-BAND ANTENNA

CROSS REFERENCE TO RELATED APPLICATION

This application is a Divisional application of Ser. No. 07/249,556, which was filed on Sep. 26, 1988 and which issued on Dec. 10, 1991 as U.S. Pat. No. 5,072,230.

BACKGROUND OF THE INVENTION

1. Field of the Invention

This invention relates to an apparatus employing a single antenna to transmit and receive, at low loss and without mutual interference, signals in different frequency bands, such as mobile telephone signals and radio broadcasting.

2. Description of the Prior Art

FIG. 1 is a block diagram of a conventional transmission/reception apparatus 50 for a mobile telephone. For mounting a mobile telephone on an automobile, the antenna provided for the reception of radio broadcasts is shared because its transmission frequency band f1 is different from the frequency band f2 of the radio broadcasts. In order to share the antenna in this way, the signal line of the mobile telephone is connected with the signal line of the radio set. Therefore, when a radio broadcast is received while using the mobile telephone, the so-called beat noise is mixed in the sound reproduced by the radio set. To prevent the generation of such beat noise, the elements shown in FIG. 1 have been used hitherto.

The frequency band f2 of radio broadcasts is, in AM broadcasts, frequency band f2*a*, that is, 500 to 1620 kHz, and, in FM broadcasts, frequency band f2*b*, that is, 76 to 90 MHz. In the mobile telephone, on the other hand, for radio communication with the ground station connected with the telephone line, a frequency band f1*a* of 870 to 890 MHz is used in receiving, and a frequency band f1*b* of 920 to 940 MHz is used in sending. The prior art shown in FIG. 1 makes use of such a difference in frequency bands.

In other words, as shown in FIG. 1, a radio set 51 is connected to an antenna 53 by way of a low pass filter 52, and the mobile telephone 54 is connected to the antenna 53 by way of a high pass filter 55. The signal line connected to the mobile telephone 54 is joined to the signal line connected to the radio set 51. During use of the mobile telephone 54, since the frequency band f1 of the signals transmitted or received by the mobile telephone 54 is relatively high, the radio set 51 will not generate beat noise by the interference with the signal in the frequency band f2 used in the mobile telephone 54 owing to the low pass filter 52.

The equivalent circuit of the antenna 53 and the typical circuit composition of the low pass filter 52 are shown in FIG. 2. A capacitor C11 is connected in series to a signal source 56, and coils L11 and L12 are connected in series to this capacitor C11. The contact point 57 of coils L11 and L12 is grounded by way of another capacitor C12.

The relation between voltage V11 generated in signal source 56 and output voltage V12 of the low pass filter 52 due to electrostatic capacity of capacitors C11 and C12 is as follows:

$$V12 = \frac{C11}{C11 + C12} \cdot V11 \quad (1)$$

That is, in the low pass filter 52, since the capacitor C12 is provided between the signal line and the ground, the output voltage V12 of the low pass filter 52 unfavorably becomes smaller than the generated voltage V11 in the signal source 56. In eq. 1, since radio broadcasts are to be received, the attenuation of signals by coils L11, L12 is assumed to be sufficiently small.

FIG. 3 is an equivalent circuit diagram in the frequency band f2*a* of AM broadcast of an antenna 61 and a cable 62 in a different prior art device.

In a car-mounted radio set, it will be very convenient if FM radio signals, AM radio signals, and mobile telephone signals can be received by one antenna. In an antenna which is extended or retracted by a motor or the like, a signal cable cannot be attached to the lower end of the antenna, and it is difficult to shorten the signal cable. Accordingly, the cable capacity of the signal cable increases, and the impedance derived from the cable capacity becomes high. In particular, in radio signals of a relatively low frequency band such as AM radio signals, the effect of cable capacity becomes larger. Therefore, in a car-mounted antenna, signals in a wide frequency band must be sent out to the radio set while suppressing the loss by the signal cable.

The antenna 61 can be expressed in terms of antenna effective capacity Ce and antenna reactive capacity Ca, and the AM radio signals received by this antenna 61 can be expressed in terms of an alternating-current power source V21. The cable 62 can be shown as a line l11 between terminals A1 and B1, and this line l11 is grounded by way of cable capacity Cb. The signal at the terminal B1 is fed into a radio set. The voltage V22 at this terminal B1 is expressed as follows:

$$V22 = \frac{Ce}{Ce + Ca + Cb} \cdot V21 \quad (2)$$

As expressed in eq. 2, supposing that the cable capacity Cb is large, the gain of the AM radio signals of relatively low frequency received by the antenna 61 is lowered so that the cable capacity Cb makes the receiving sensitivity and the ratio of signal to noise (S/N ratio) drop.

To prevent such a drop in receiving sensitivity and S/N ratio, an amplifier (not shown) is placed between the antenna 61 and the cable 62, that is, at the position of terminal A1, so that the receiving sensitivity and S/N ratio are improved. In such an antenna, since active elements are used, they give rise to an increase in cost, and also involve other problems such as maintaining a circuit characteristic of suppressing only the distortion of signals at the time of input of a strong electric field. In addition, new problems may be also experienced, such as loss due to impedance conversion in the amplifier, and insufficient matching of impedance.

SUMMARY OF THE INVENTION

It is hence a primary object of this invention to present a novel, improved transmission and reception apparatus for automobiles which solves the above-discussed problems.

It is another object of this invention to provide a branching filter capable of suppressing the mutual interference of signals between plural communication means using different frequency bands.

To achieve this object, a branching filter of this invention comprises:

a first communication means for transmitting at least in a first frequency band f1;

a second communication means for receiving at least in a second frequency band f2 which is different from the first frequency band f1; and a band inhibiting means possessing an electrostatic capacity which has a larger impedance in the first frequency band f1 and is connected in series to the signal line of the second communication means.

The branching filter of this invention has the signal line from the communication means for facilitating the transmission or reception of signals at least in the first or second frequency band f1, f2 connected to a common antenna.

The signal line of the second communication means is provided with band inhibiting means having an electrostatic capacity in series with the signal line and having a larger impedance in the first frequency band f1. Therefore, electrostatic capacity does not occur between the signal line of the second communication means and the ground, and the signal level will not be reduced by the band inhibiting means. Besides, the signal in the first frequency band f1 at least transmitted by the first communication means is inhibited by the band inhibiting means, so that there is no adverse effect on the reception of signals by the second communication means.

Thus, according to this invention, the effect of the transmission signal of the first communication means on the reception signal of the second communication means can be suppressed without lowering the level of reception by the second communication means, and mutual interference between the transmission and reception signals of the antenna commonly used in different frequency bands f1, f2 can be suppressed.

In a further different preferred embodiment, the band inhibiting means is a parallel resonance circuit connected to the signal line, and its resonance frequency is selected in the first frequency band f1.

In another preferred embodiment, the first communication means transmits and receives signals for a mobile telephone, while the second communication means is a radio set for receiving signals in the frequency band f2 lower than the frequency band f1 of the first communication means, and the band inhibiting means is designed to inhibit signal within the transmission and reception frequency band f1 of the first communication means.

In a further preferred embodiment, the band inhibiting means is a series connection of parallel resonance circuits for resonating in the reception frequency band f1*a* and the transmission frequency band f1*b* of the first communication means.

In another preferred embodiment, a bypass filter for allowing signals in the first frequency band f1 to pass and blocking signals in the second frequency band f2 is provided in the signal line connecting the first communication means and the antenna.

It is still a different object of the present invention to provide an antenna circuit capable of enhancing the reception sensitivity and S/N ratio in a wide frequency band.

To achieve the above object, in an antenna circuit according to the present invention which is provided between the antenna and an antenna input circuit of a radio set for receiving a first radio signal in a first frequency band f2*a* and a second radio signal in a second frequency band f2*b* which is a higher frequency band than the first frequency band f2*a*, the improvement comprising:

a signal cable;

a first impedance conversion circuit connected between the signal cable and the antenna for converting the impedance in the first frequency band f2*a* from high impedance to low impedance;

a first filter circuit connected between the signal cable and the antenna for allowing signals in the second frequency band f2*b* to pass;

a second impedance conversion circuit connected between the signal cable and the antenna input circuit for converting the impedance in the first frequency band f2*a* from low impedance to high impedance; and a second filter circuit connected between the signal cable and the antenna input circuit for allowing signals in the second frequency band f2*b* to pass.

According to this invention, between the antenna and the signal cable is disposed means for adjusting the impedance, said means being composed of a first filter circuit for allowing the first radio signals in the first frequency band f2*a* to pass, and a first impedance conversion circuit for converting the impedance in the second frequency band f2*b* from high impedance to low impedance. And between the signal cable and the antenna input circuit of the radio set is disposed means for adjusting the impedance, said means being composed of a second filter circuit for allowing the second radio signals in the second frequency band f2*b* to pass, and a second impedance conversion circuit for converting the impedance in the first frequency band from low impedance to high impedance.

The second radio signals are sent out to the radio from the antenna by way of the first filter circuit, while the first radio signals are converted with respect to impedance by the first impedance conversion circuit. Thus, loss due to the cable capacity in the signal cable is reduced, and the signal is transmitted to the radio set. The second radio signals are then transmitted to the antenna input circuit radio set through the second filter circuit, while the first radio signals are converted into an impedance matched with the antenna input circuit of the radio set by the second impedance conversion circuit, and are transmitted to the antenna input circuit of the radio set. Therefore, the radio signals over a wide frequency band can be transmitted to the radio set without increasing loss in the antenna and signal cable.

In this way, according to this invention, when radio signals are received by the antenna, the loss of reception signals due to capacitative impedance of the signal cable may be reduced. Therefore, the reception sensitivity and S/N ratio in a wide frequency band can be outstandingly enhanced.

In a preferred embodiment, the first and second filter circuits are series circuits of a coil and a capacitor.

In a preferred embodiment, the first and second impedance conversion circuits are transformers.

In a still further preferred embodiment, at least one of the primary and secondary windings of the transformer is connected in series with a coil for reducing the loss due to the stray capacity of the transformer.

DESCRIPTION OF THE DRAWINGS

These and other objects of this invention, as well as the features and advantages thereof, will be understood and appreciated more clearly from the following detailed description in conjunction with the accompanying drawings, in which.

DETAILED DESCRIPTION OF THE PREFERRED EMBODIMENTS

Figure 1:
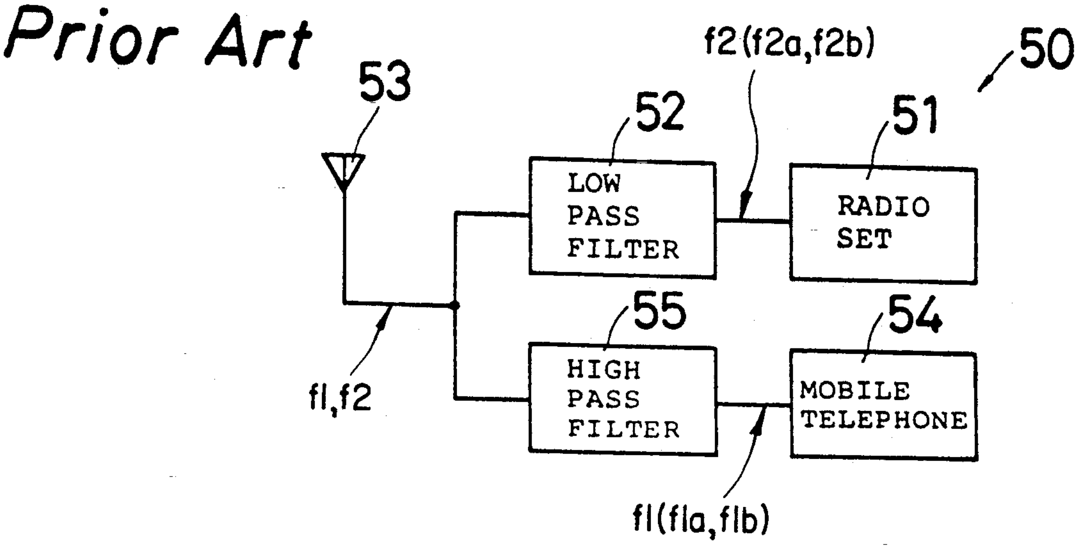
Fig. 1 Prior Art
FIG. 1 is a block diagram of a conventional transmission and reception apparatus.
Figure 2:
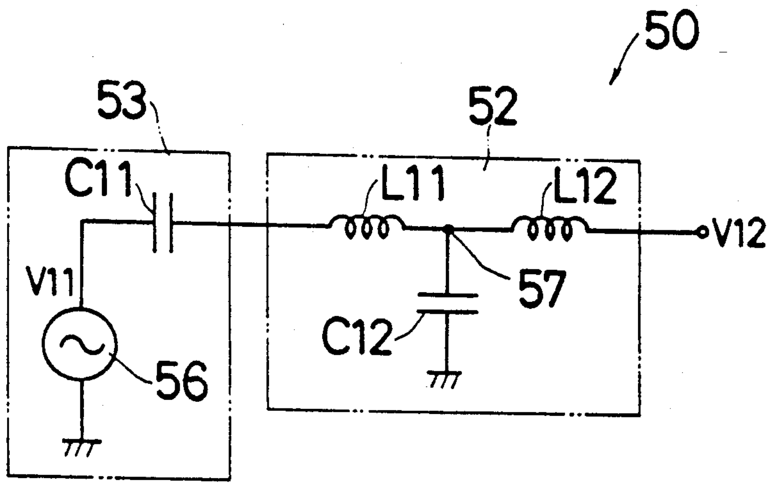
Fig. 2 Prior Art
FIG. 2 is an electric circuit diagram showing the equivalent of an antenna 53 and a low pass filter 52 of a transmission and reception apparatus 50.

Referring now to the drawings, preferred embodiments of this invention are described in detail below.

Figure 4:
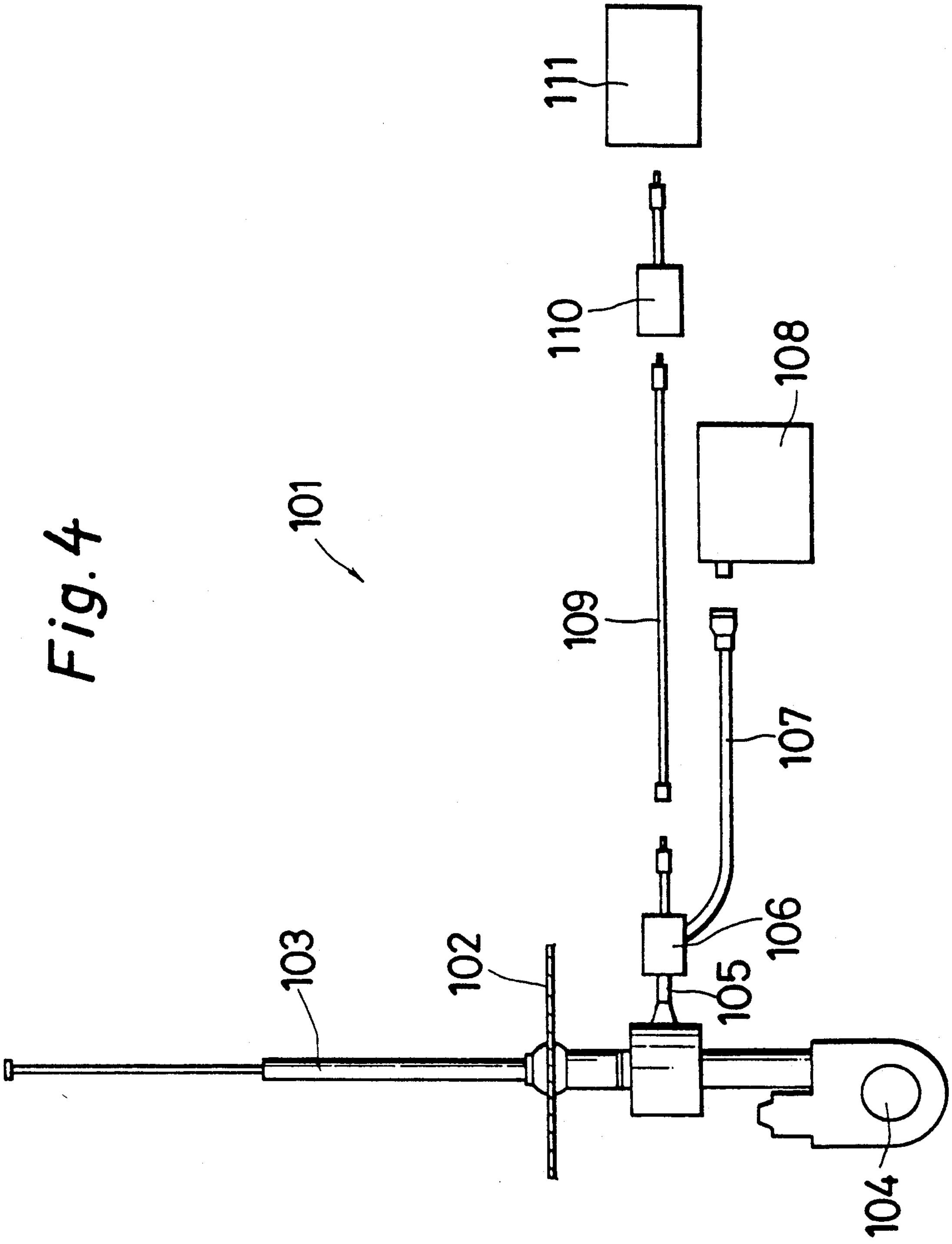
FIG. 4 is an overall schematic of a mobile transmission and reception apparatus according to the present invention.

FIG. 4 is an overall schematic of a mobile transmission and reception apparatus 101 according to the present invention.

On an automobile car body 102 is erected a multiband whip antenna 103 which is used commonly for the transmission and reception of signals for a mobile telephone and for the reception of a radio broadcasts. This antenna 103 is telescopically driven by a motor 104 installed at its lower end. The antenna 103 is connected to a branching filter 106 by way of a coaxial cable 105, and signals for the mobile telephone are transmitted or received by a mobile telephone transmitter/receiver 108 by way of a coaxial cable 107, while the reception signals of a radio broadcast are transmitted to a radio set 111 by a coaxial cable 109 through an antenna circuit 110.

Figure 5:
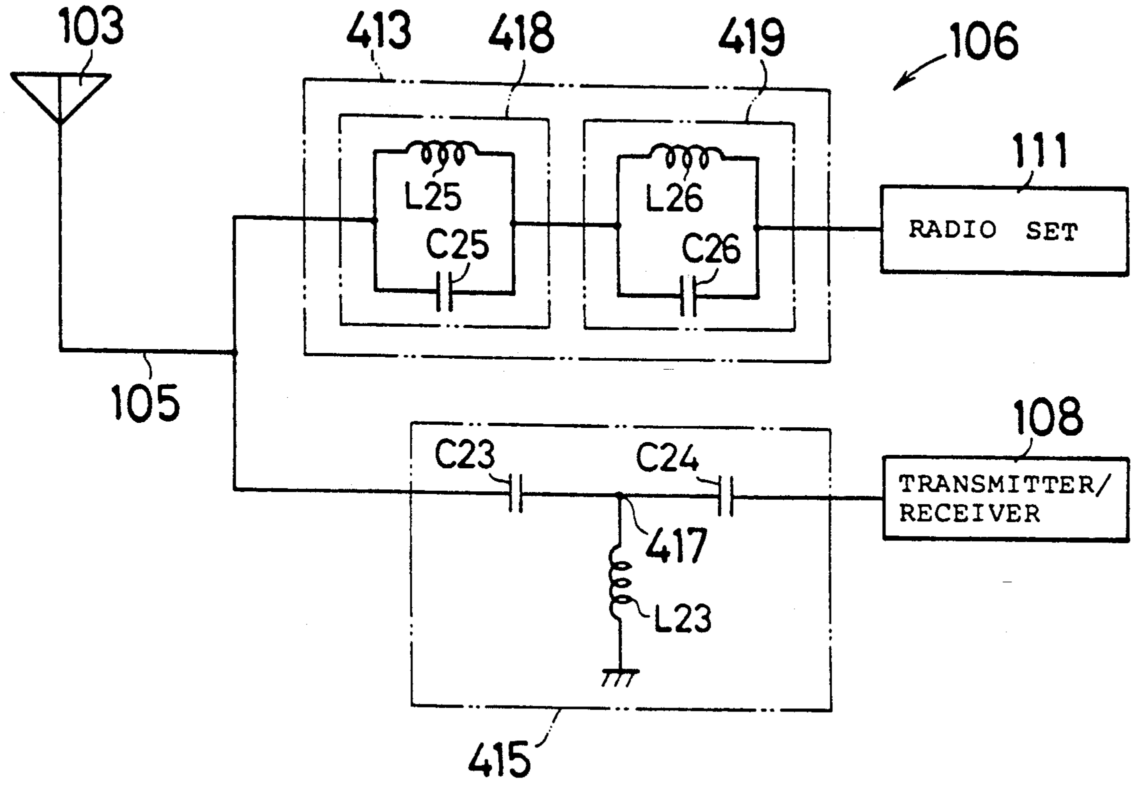
FIG. 5 is an electric circuit diagram of an embodiment of a branching filter according to the present invention.

FIG. 5 is an electric circuit diagram of a branching filter 106 in an embodiment according to the invention. The antenna 103 mounted on an automobile is connected to a band inhibiting filter 413 by way of a cable 105 which constitutes a signal line. The output of the band inhibiting filter 413 is applied to a radio set 111 which constitutes second communication means. The coaxial cable 105 is connected with a transmitter/receiver 108 of a mobile telephone, which constitutes first communication means, by way of a high pass filter 415.

The transmitter/receiver 108 of the mobile telephone performs radio communications with the ground station connected in the telephone line network in a first frequency band f1, that is, in a frequency band f1*a* of 870 to 890 MHz of received signals, and in a frequency band f1*b* of 920 to 940 MHz of transmitted signals. On the other hand, the radio broadcast received in a radio set 111 using a second frequency band f2, that is, a frequency band f2*a* of 500 to 1620 kHz for AM broadcasts, and a frequency band f2*b* of 76 to 90 MHz for FM broadcasts. Therefore, during the reception of a radio broadcast by radio set 111, if a mobile telephone is used, it is sufficient for the signals in the frequency bands f1*a* and f1*b* during reception and transmission to be inhibited by the band inhibiting filter 413.

The high pass filter 415, operatively disposed between the coaxial cable 105 and the transmitter/receiver 108 of the mobile telephone, comprises a series connection of capacitors C23 and C24. A connecting point 417 of these capacitors C23 and C24 is grounded through a coil L23, thereby allowing signals in the frequency band f1 of the mobile telephone to pass thereby and cutting off the signals in the frequency band f2 of the radio broadcasts. Meanwhile, the band inhibiting filter 413 is composed of a first band inhibiting filter 418 for inhibiting the frequency band f1*a* of 870 to 890 MHz, and a second band inhibiting filter 419 for inhibiting the frequency band f1*b* of 920 to 940 MHz.

The first and second band inhibiting filters 418 and 419 are connected in series to the coaxial cable 105. The first band inhibiting filter 418 comprises coil L25 and a capacitor C25, while the second band inhibiting filter 419 comprises coil L26 and capacitor C26. The inductance of coils L25 and L26, and the electrostatic capacity of a capacitors C25 and C26 are properly selected so as to inhibit the signals in the above frequency bands f1*a* and f1*b*.

Figure 6:
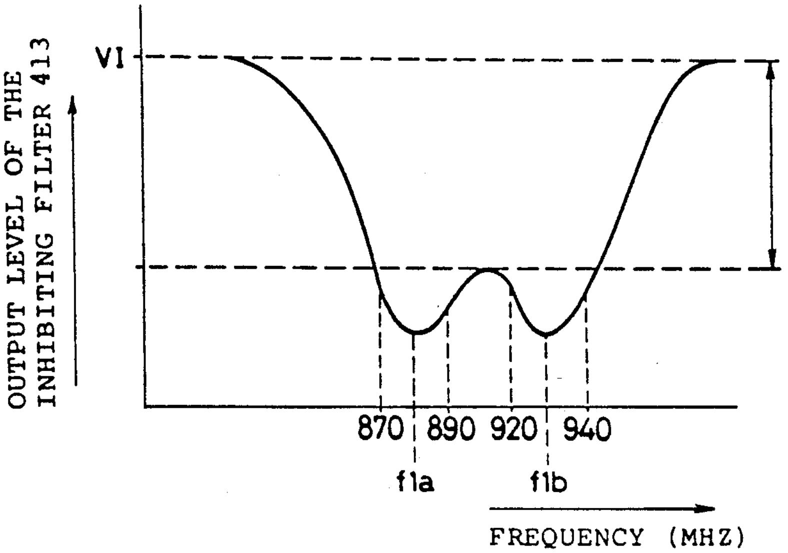
FIG. 6 is a graph showing frequency characteristics of a band inhibiting filter 413.

FIG. 6 is a graph showing the frequency characteristics of the band inhibiting filter 413. The band inhibiting filter 413 operates during the use of the mobile telephone, and inhibits the transmission of signals the transmission from the antenna 103 during a reception mode (i.e. frequency band f1*a*), and the transmission of signals from the transmitter/receiver 108 of the mobile telephone during a transmission mode (i.e. frequency band f1*b*). In the radio set 111, generation of noise does not matter if such is at less than 110 dV $\mu$v (+3 dBmW) at input voltage. On the other hand, the transmission output of the transmitter/receiver 108 of the mobile telephone is 5 W (+37 dBmW) in Japan. Therefore, the band inhibiting filter 413 is composed so that the input signal level may be attenuated more than 34 dB and delivered in the frequency bands f1*a* and f1*b* of 870 to 890 MHz and 920 to 940 MHz. FIG. 6 shows the frequency characteristics with respect to the input signal level VI.

Thus, in this embodiment, during use of the mobile telephone, interference of reception signals (870 to 890 MHz) transmitted to the radio set 111 is prevented by the first band inhibiting filter 418, whereas the interference of transmission signals (920 to 940 MHz) transmitted to the radio set 111 is prevented by the second band inhibiting filter 419. In addition, between the signal line of the radio set 111 and the ground there is no intervening electrostatic capacity such as that effected by a capacitor so that a drop in voltage level induced by antenna 103 by band inhibiting filter 413 during the reception mode of a radio broadcast will never occur.

In this manner, without lowering the reception signal level of the radio set 111, effects of the transmission and reception signals for the mobile telephone on the reception of signals of a radio broadcast may be suppressed, and mutual interference between the transmission and reception signals of the antenna commonly used in different frequency bands f1 and f2 may be suppressed.

Figure 7:
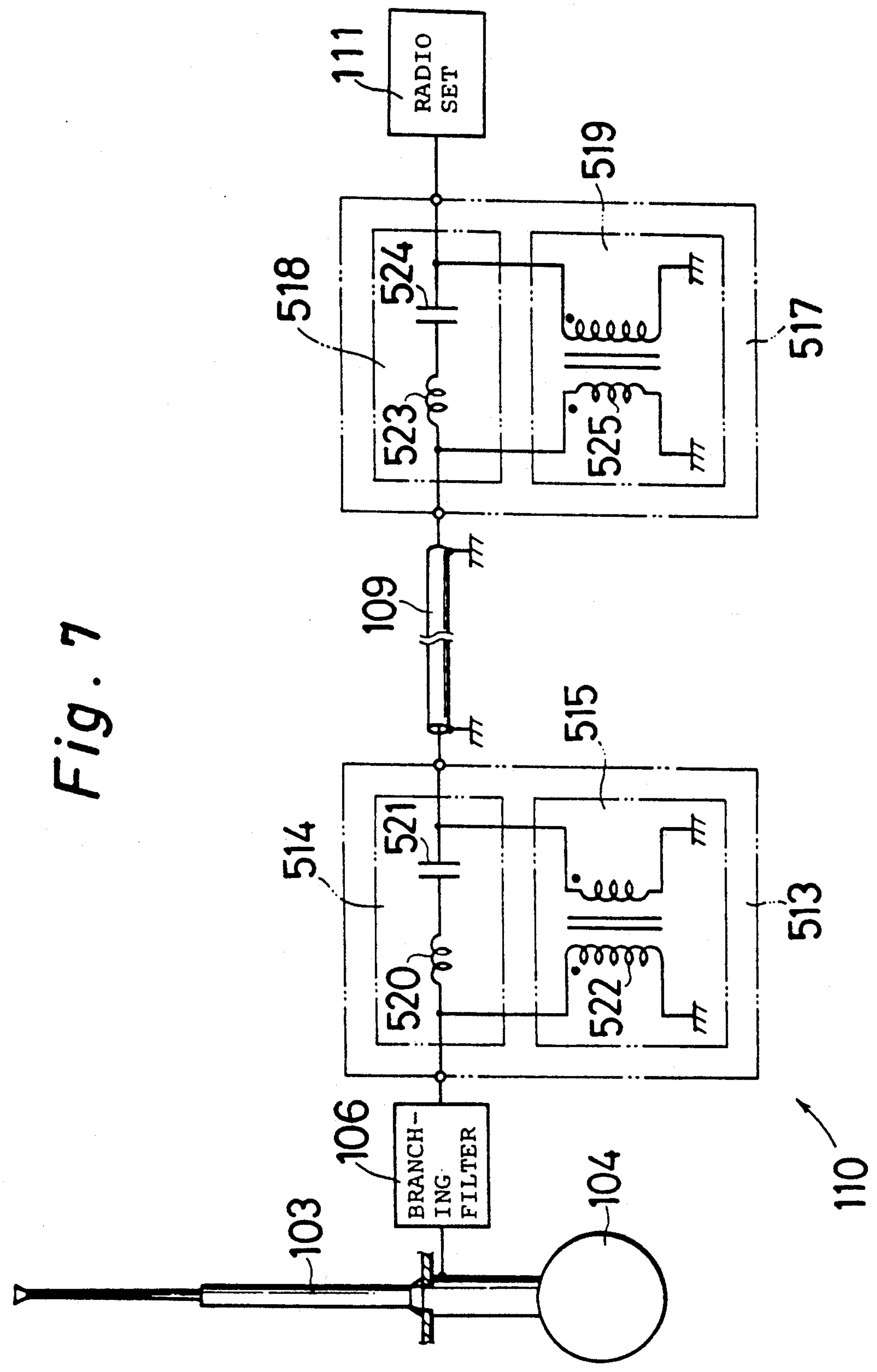
FIG. 7 is a schematic of an embodiment of an antenna circuit according to the present invention.
Figure 8:
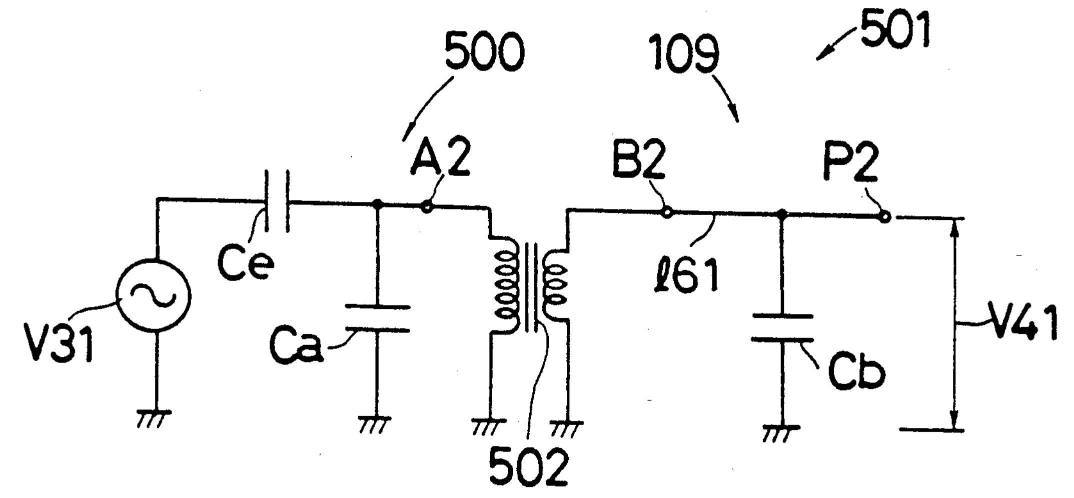
FIG. 8 is an equivalent circuit diagram of an antenna circuit for explaining the principle of the present invention.

FIG. 7 is a schematic of an antenna circuit 110 in a different embodiment of this invention, and FIG. 8 is an equivalent circuit diagram associated with AM radio frequency band f2*a* of an antenna circuit 501 for explaining the principle of this invention. The antenna 500 is represented by an antenna reactive capacity Ca connected to ground, and an antenna effective capacity Ce connected in series with an AM radio signal which is a first radio signal received by this antenna 500 is represented as an alternating-current power source V31. A coaxial cable 109 is represented by a line 161 between terminals B2 and P2, and this line 161 is grounded by way of a cable capacity Cb. Between the antenna 500 and the coaxial cable 109 is interposed a transformer 502 for changing the impedance of the circuit. The signal at terminal P2 is transmitted to the antenna input circuit in the radio set 111. The voltage V41 at this terminal P2 is expressed as follows, denoting the ratio of the number of turns of the coil at the input side to the output side of the transformer 502 n:1

$$V41 = \frac{Ce}{Ce + Ca + Cb/n^2} \cdot V31 \qquad (3)$$

Figure 3:
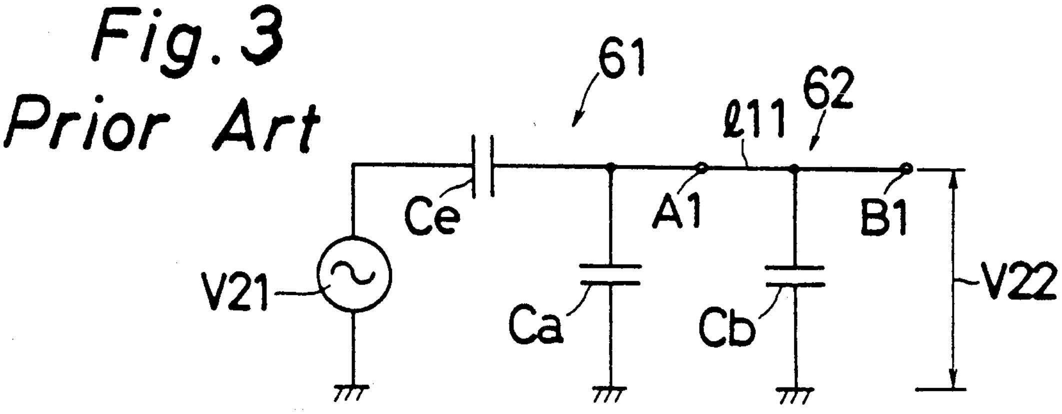
Fig. 3 Prior Art
FIG. 3 is an equivalent circuit diagram in a frequency band of AM broadcast in a conventional antenna 61 and a cable 62.

As understood from eq. 3, by additionally installing the transformer 502, the effect relating to the cable capacity Cb may be reduced to $1/n^2$ of that in the circuit illustrated in FIG. 3. Therefore, the impedance derived from the cable capacity Cb as taken at the terminal A2 is converted to $1/n^2$ of that by the transformer 502 so that the loss at the coaxial cable 109 may be reduced.

Referring to FIG. 7, the antenna circuit 110 is composed of an antenna 103, the coaxial cable 109, an impedance adjusting circuit 513 interposed between the antenna 103 and the coaxial cable 109, and the impedance adjusting circuit 517 interposed between the coaxial cable 109 and the radio set 111. In FIG. 4, meanwhile, the impedance adjusting circuit 513 is built in the branching filter 106. Reference numeral 104 denotes an antenna motor, and 106 denotes a branching circuit.

The output from the antenna 103 is applied to the impedance adjusting circuit 513 through the branching filter 106. The impedance adjusting circuit 513 has a low impedance in the frequency band f2*b* of FM radio signal, and comprises an FM radio signal filter circuit 514 which constitutes a first filter circuit, and an impedance conversion circuit 515 which comprises a transformer 522 and constitutes a first impedance conversion circuit connected in parallel to circuit 514. The FM radio signals received by the antenna 103 are delivered to the coaxial cable 109 through FM radio signal filter circuit 514.

The FM radio signal filter circuit 514 is composed, for example, of a series connection of a coil 520 and a capacitor 521, and functions as a high pass filter with a low impedance against FM frequency band f2*b*.

The radio signal from the coaxial cable 109 is transmitted to the impedance adjusting circuit 517. The impedance adjusting circuit 517 is composed of an FM radio signal filter circuit 518 which filters FM radio signals and constitutes a second filter circuit, and an impedance conversion circuit 519 which effects impedance conversion action on AM radio signals and constitutes a second impedance conversion circuit.

The FM radio signal filter circuit 518 is connected in parallel to the impedance conversion circuit 519, and the FM radio signals from the coaxial cable 109 are led out into the antenna input circuit of the radio set 111 through the FM radio signal filter circuit 518. The FM radio signal filter circuit 518 is, for example, composed of a coil 523 and a capacitor 524, and functions as a high pass filter for filtering relatively high frequency signals such as FM radio signals. The impedance conversion circuit 519 comprises a transformer 525 as in the first impedance conversion circuit 522 mentioned above.

Therefore, the inductance of coils 520 and 523 in the FM radio signal filter circuits 514 and 518, and the electrostatic capacity of capacitors 521 and 524 are properly selected so as to possess the resonance frequency in the FM radio signal frequency band, respectively.

Figure 9:
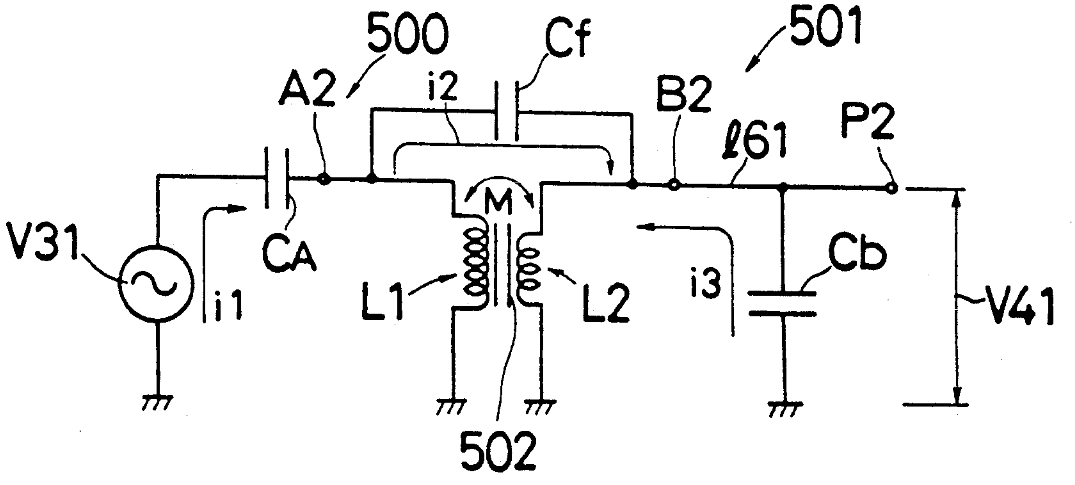
FIG. 9 is an equivalent circuit diagram for explaining the principle under consideration with respect to the capacity Cf in the equivalent circuit shown in FIG. 8.

In the circuit 501 shown in FIG. 8, however, there is actually an effect of the capacity in the FM radio signal filter circuit 514 shown in FIG. 7. An equivalent circuit diagram which illustrates the principle under consideration related to such a capacity component Cf is shown in the circuit 501 of FIG. 9. Reference numerals A2, B2, P2 and 61 are the same as those shown in FIG. 8. For the sake of simplicity, the antenna effective capacity Ce and the antenna reactive capacity Ca are collectively expressed as $C_A$. Incidentally, the transformer 502 corresponds to the transformer 522 in FIG. 7, while the antenna 500 corresponds to the antenna 103. A self-inductance $L_1$ is provided at the input side, a self-inductance $L_2$ is provided at the output side, and there is a mutual inductance M between the input side and the output side. Therefore, between the alternating-current power source V31 derived from the radio signal received by the antenna 500, and the voltage level V41 applied to the radio set 111, the following relation is established, assuming the current from the antenna 500 to be i1, the current flowing in the capacity component Cf to be i2, and the current due to cable capacity Cb to be i3:

$$V31 = \left(\frac{1}{jwC_A} + jWL_1\right)i1 + (jwM - jwL_1)i2 + jwMi3 \qquad (4)$$

$$0 = jwMi1 + (jwL_2 - jwM)i2 + \left(jwL_2 + \frac{1}{jwCb}\right)i3 \qquad (5)$$

$$V31 = \frac{1}{jwC_A}\,i1 + \frac{1}{jwCf}\,i2 - \frac{1}{jwCb}\,i3 \qquad (6)$$

And, $$V41 = \frac{1}{jwCb}\,i3 \qquad (7)$$

Therefore, solving the above equations, the following relation is established:

$$V41 = \frac{\{\omega^4 C_A Cf(L_1L_2 - M^2) - \omega^2 C_A M\} V31}{\omega^4 (C_ACf + C_ACb + CbCf)(L_1L_2 - M^2) - \omega^2\{L_1(C_A + Cf) + L_2(Cb + Cf) - 2MCf\} + 1} \quad (8)$$

Where $\omega$ denotes the angular frequency of the received radio signal.

At this time, when the denominator of eq. 8 is zero, V41 reaches the maximal value. Supposing here that the mutual inductance M is expressed as $k\sqrt{L_1 \cdot L_2}$ (where k is a coupling coefficiency of transformer 502), the maximal value of V41 is expressed as follows:

$$f = \frac{1}{2\pi}\sqrt{\frac{-Y \pm \sqrt{Y^2 - 4XZ}}{2X}} \quad (9)$$

where $$X = (C_ACf + C_ACb + CbCf)(1 - k^2)L_1L_2 \quad (10)$$

$$Y = -\{L_1(C_A + Cf) + L_2(Cb + Cf) - 2Cf \cdot k\sqrt{L_1L_2}\} \quad (11)$$

$$Z = 1 \quad (12)$$

Figure 10:
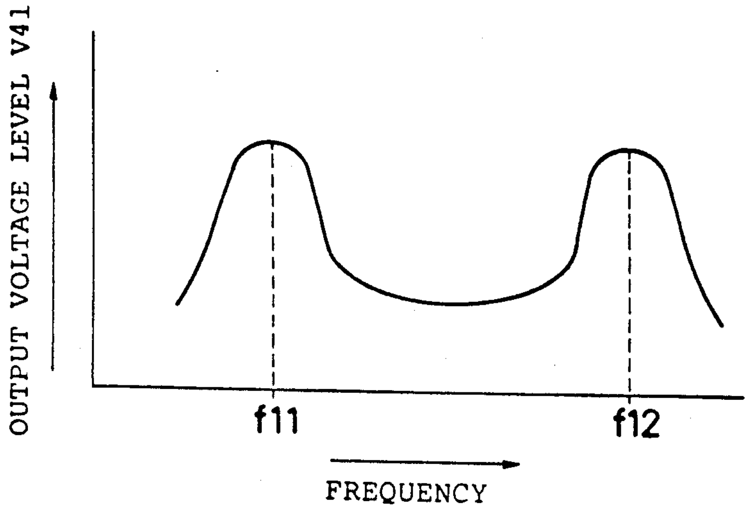
FIG. 10 is a graph showing the relation between reception frequency f and output voltage level V41 in the equivalent circuit shown in FIG. 9.

Thus, as shown in eq. 9 the voltage level V41 comes to possess the maximal value with respect to two values differing in frequency f. Supposing the frequencies corresponding to the maximal value of voltage level V41 to be f11, f12 (f11<f12), the relation between frequency f and voltage level Vc is shown in FIG. 10. As understood from eq. 9 to eq. 11, as the coupling coefficient k becomes smaller, the frequency f12 becomes lower. Therefore, by increasing the coupling coefficient k possessed by the transformer 502, when the AM radio frequency band f2*a* is adjusted to settle within frequency f11 and frequency f12, a flat reception characteristic will be obtained in the AM radio signal frequency band f2*a*. A transformer 502 capable of increasing the coupling coefficient includes, for example, the so-called sandwich winding or bifilar winding type.

Figure 11:
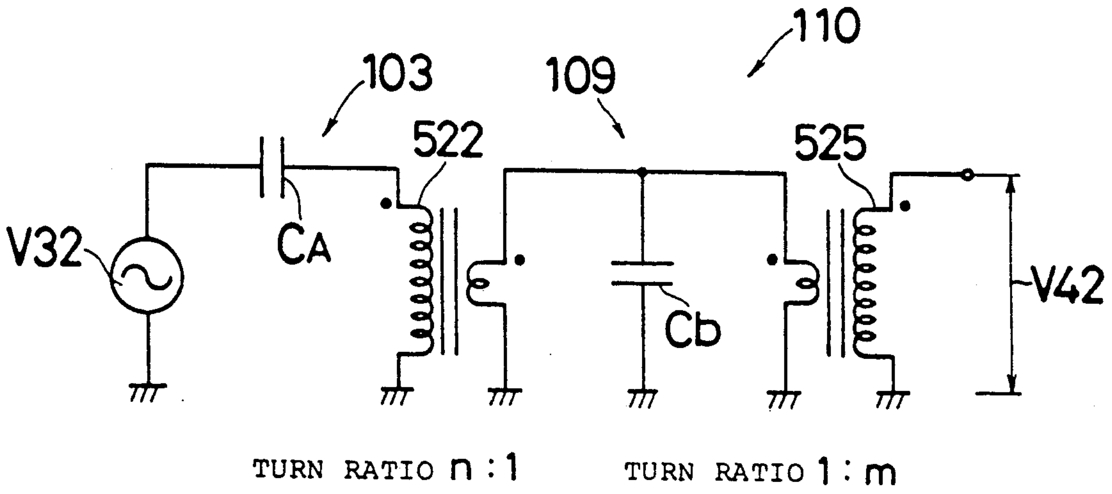
FIG. 11 is an equivalent circuit diagram in an AM radio signal frequency band f2*a* of an antenna circuit.

FIG. 11 is an equivalent circuit diagram in an AM radio signal frequency band f2*a* of the antenna circuit 110 in FIG. 7. The transformers 522 and 525 correspond to those shown in FIG. 7 and Cb denotes the cable capacity. The antenna 103 may be represented as a capacity $C_A$ comprising the antenna effective capacity possessing a series electrostatic capacity with respect to the radio signal, and the antenna reactive capacity generated between the radio signal and ground. Referring again to FIG. 7, the radio signal received by antenna 103 may be represented by alternating-current power source V32.

The AM radio signal received by antenna 103 has a high impedance in the FM radio signal filter circuit 514, and therefore are led into the impedance conversion circuit 515. In the impedance conversion circuit 515, the turn ratio of the number of turns at the input side and the output side of the transformer 522 is n:1. Accordingly, the voltage of the AM radio signal is reduced to 1/n and the impedance is reduced to $1/n^2$ by the transformer 522. The coaxial cable 109 gives rise to a cable capacity Cb between the radio signal and ground.

Relative to a high frequency signal, for example, a FM radio signal, the coaxial cable 109 has a low impedance. However, with respect to a relatively low frequency signal such as an AM radio signal, the impedance of the coaxial cable 109 due to cable capacity Cb is large. In this embodiment, the impedance of the AM radio signal is reduced by the impedance conversion circuit 515, so that the loss relating to cable capacity Cb may be reduced.

The signal in a relatively low frequency band f2*a* such as an AM radio signal from the coaxial cable 109 is high in impedance in the FM radio signal filter circuit 518, and is led to the impedance conversion circuit 519. In the transformer 525 of the impedance conversion circuit 519, the ratio m of the number of turns 1 at the input side to that at the output side is set, and the AM radio signal led to this transformer 525 is amplified in voltage, and is delivered into the antenna input circuit of the radio set 111.

The relation between the alternating-current power source V32 and the output voltage V42 is expressed in the following equation.

$$V42 = V32 \cdot \frac{m}{n} \cdot \frac{C_A}{C_A + Cb/n^2} \quad (13)$$

A capacity $C_{TA}$ of the antenna circuit 110 as seen from the radio set 111 is expressed as follows:

$$C_{TA} = \frac{C_A \cdot n^2 + Cb}{m^2} \quad (14)$$

For example, this capacity $C_{TA}$ is defined at 80 pF in correspondence with the impedance matching with the radio set, and the capacity $C_A$ and the cable capacity Cb are determined by the length of the antenna 103 and the coaxial cable 109. Therefore, the turn ratios n and m of the transformer 522 and 525 are selected so as to satisfy eq. 14 above.

The equivalent circuit of antenna circuit 110 as seen from the radio set 111 may be expressed as the inductance $L_0/2$ and capacity $C_{TA}$ connected in parallel, assuming the inductance at transformers 522 and 526 to be $L_0$. Supposing the resonance frequency of such a circuit to be fp, the inductance $L_0$ may be expressed as follows:

$$L_0 = \frac{2}{(2\pi fp)^2 \cdot C_{TA}} \quad (15)$$

It is desired to flatten the frequency characteristics in the AM radio signal frequency band f2*a* by selecting the resonance frequency fp at, for example, 250 kHz or other frequency outside the AM radio signal frequency band f2*a*. Accordingly, the inductance $L_0$ of the transformers 522 and 525 is determined by eq. 15.

Thus, in the antenna circuit 110, for example, when an AM radio signal and a FM radio signal are commonly received by one antenna 103, the loss of the AM radio signal at the coaxial cable 109 may be lowered. For instance, assuming the antenna effective capacity Ce to be 15 pF, the antenna reactive capacity Ca to be 5 pF, the cable capacity Cb to be 120 pF, and the turn ratios n and m to be 4, the gain is improved by about 9 dB as calculated according to eq. 2 and eq. 3.

In the foregoing embodiments, the loss will be greater if too large of a value is set for the turn ratios n and m of the transformers 522 and 525, or the effect will be smaller if too small of a value is used. According to an experiment conducted by the present inventors, favorable results are obtained when a numerical value of 10 or less is selected for the turn ratios n and m.

Figure 12:
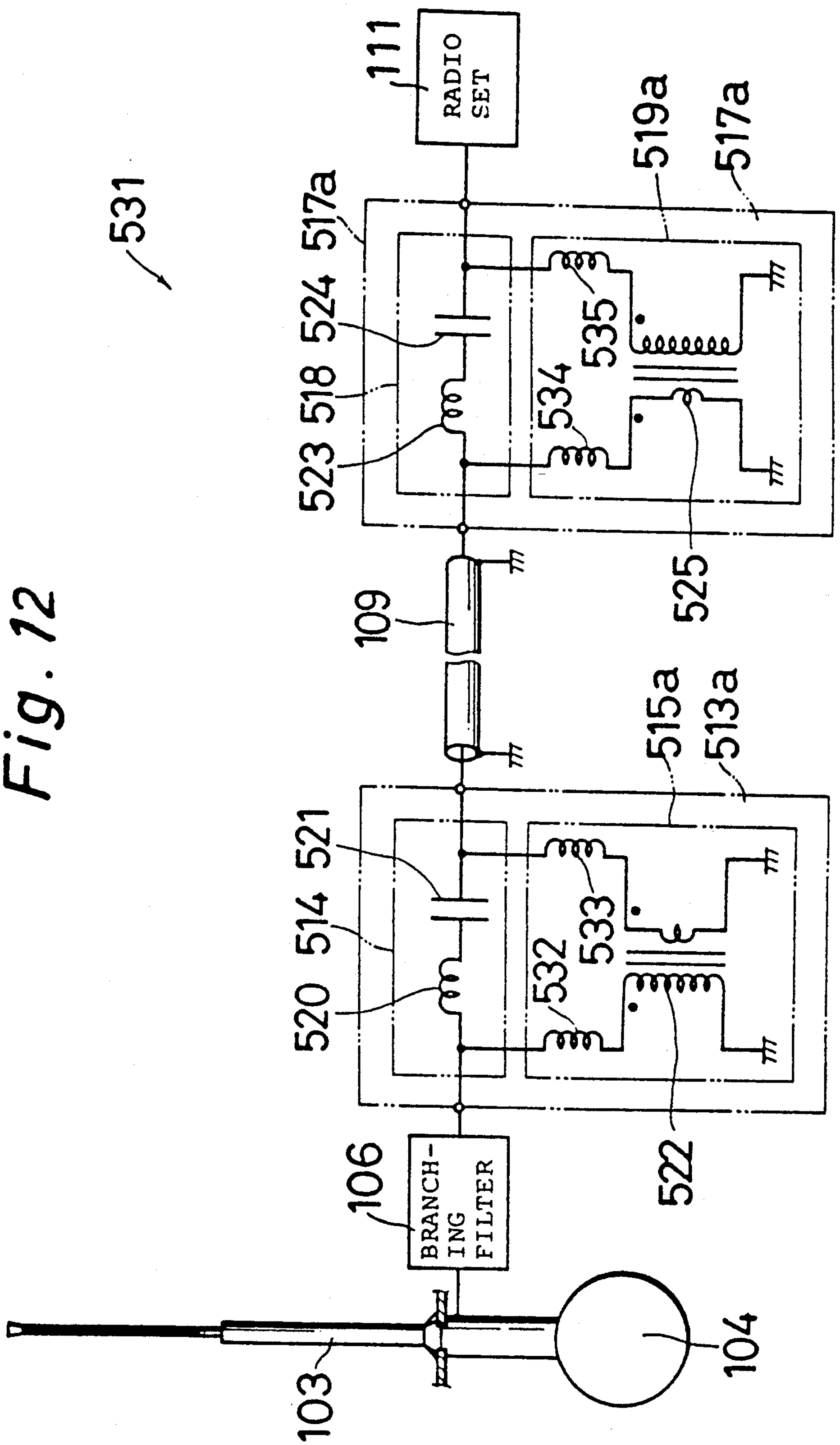
FIG. 12 is a schematic of still a further embodiment of an antenna circuit according to the present invention.

FIG. 12 is a schematic of an antenna circuit 531 in still another embodiment according to the present invention. The parts corresponding to the foregoing antenna circuit 110 are identified with same reference numbers. Reference numeral 104 denotes an antenna motor, and 106 denotes a branching circuit. In the antenna circuit 531, the impedance conversion circuit 515*a* of the impedance adjusting circuit 513*a* comprises coils 532 and 533 and the transformer 522. And, in the impedance adjusting circuit 517*a*, the impedance conversion circuit 519*a* comprises coils 534 and 535 and the transformer 525. In order to reduce the loss due to the stray capacity associated with the transformers 522 and 525, coils 532 to 535 are employed at the input end and the output end of the transformers 522 and 525, respectively. As a result, the loss attributable to the stray capacity of the transformers 522 and 525 is prevented, and the reception sensitivity and the S/N ratio may be further enhanced.

In the foregoing embodiments, the loss in the AM radio signal frequency band f2*a* due to stray capacity, in particular, can thus be reduced, while the reception sensitivity and the S/N ratio in the radio receiver may be outstandingly enhanced. Therefore, when receiving signals in a wide frequency band by a signal antenna, for example, both FM and AM radio signals are particularly effectively received by a car-mounted antenna constructed according to the present invention.

Besides, depending on the type of antenna in general the antenna reactive capacity varies more significantly than the antenna effective capacity. When this invention is applied to an antenna with a large antenna reactive capacity, its effect will be manifest. Meanwhile, the polarity of the transformers 522 and 525 may be either normal phase or reverse phase, but according to experiments, a greater effect will be obtained when transformers 522 and 525 of a normal phase are used.

This embodiment is described with respect to receiving an FM radio signal and an AM radio signal. However, it may be also favorably embodied in applications in which radio signals and other signals such as mobile telephone signals are received at the same time.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced thereby.

We claim:

1. A branching filter which connects a signal line of a first communication means, for transmitting and receiving at least in a first frequency band f1, to a common multi-band antenna and which connects a signal line of a second communication means, for receiving at least in a second frequency band f2, to the common multiband antenna, wherein the first communication means is a mobile telephone configured for transmission in a transmission frequency band f1*b* and reception in a reception frequency band f1*a*, and the second communication means is a radio set for receiving the frequency band f2 which is lower than the frequency band f1 of the first communication means, said branching filter comprising:

a band inhibiting means possessing an electrostatic capacity having an increased impedance in the first frequency band f1 relative to an impedance thereof in the second frequency band f2 and connected in series between the signal line of the second communication means and the common multi-band antenna, said band inhibiting means configured to inhibit a transmission and reception signal in the frequency band f1 of the first communication means;

said band inhibiting means including series connected first and second resonance circuits, respectively coupled to the common multiband antenna and the second communication means, for respectively resonating in the reception frequency band f1*a* and the transmission frequency band f1*b* of the first communication means, each of said first and second resonance circuits comprising parallel connected capacitive and inductive elements.

2. A branching filter according to claim 1, further comprising a bypass filter for passing the first frequency band f1 and blocking the second frequency band f2, the bypass filter connected in series between the signal line of the first communication means and the common multiband antenna.

3. An antenna circuit provided between an antenna and an antenna input circuit of a radio set for receiving a first radio signal in a first frequency band f2*a* and a second radio signal in a second frequency band f2*b* which is a higher frequency band than the first frequency band f2*a*, said antenna circuit comprising:

a signal cable;

a first impedance conversion circuit connected between the signal cable and the antenna for converting an impedance thereof in the first frequency band f2*a* from a high impedance to a low impedance;

a first filter circuit connected in parallel to the first impedance conversion circuit between the signal cable and the antenna for passing a signal in the second frequency band f2*b*;

a second impedance conversion circuit connected between the signal cable and the antenna input circuit for converting the impedance thereof in the first frequency band f2*a* from a low impedance to a high impedance; and a second filter circuit connected in parallel to the second impedance conversion circuit between the signal cable and the antenna input circuit for passing a signal in the second frequency band f2*b*;

wherein at least one of the first and second impedance conversion circuits is comprised of a coil and a transformer having a primary and a secondary winding, said coil connected in series between a corresponding one of the first and second filter circuits and one of the primary and the secondary winding of the transformer, said coil for reducing loss caused by a stray capacity of the transformer.

4. An antenna circuit according to claim 3, wherein the first filter circuit is a first series circuit of a coil and a capacitor connected in series between the signal cable and the antenna, and the second filter circuit is a second series circuit of a coil and a capacitor connected in series between the signal cable and the antenna input circuit.

* * * * *